(12) United States Patent
Yokoyama

(10) Patent No.: US 6,559,510 B1
(45) Date of Patent: May 6, 2003

(54) STATIC RANDOM ACCESS MEMORY DEVICE

(75) Inventor: Hiroaki Yokoyama, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/709,216

(22) Filed: Nov. 9, 2000

(30) Foreign Application Priority Data

Nov. 12, 1999 (JP) .......................................... 11-322003

(51) Int. Cl.$^7$ ............................................... H01L 27/11
(52) U.S. Cl. ....................... 257/380; 257/382; 257/904; 257/921
(58) Field of Search ................ 257/380, 382, 257/903, 904, 921

(56) References Cited

U.S. PATENT DOCUMENTS

| | | | | |
|---|---|---|---|---|
| 4,841,481 A | * | 6/1989 | Ikeda et al. | 257/903 |
| 5,079,611 A | * | 1/1992 | Ikeda et al. | 257/904 |
| 5,877,051 A | * | 3/1999 | Manning | 257/904 |
| 5,917,247 A | * | 6/1999 | Narita | 257/904 |

FOREIGN PATENT DOCUMENTS

| | | |
|---|---|---|
| EP | 0 453 961 A2 | 10/1991 |
| JP | 62-31155 | 2/1987 |
| JP | 02-014567 | 1/1990 |
| JP | 04-003465 | 1/1992 |
| JP | 8-23037 | 1/1996 |

\* cited by examiner

Primary Examiner—Gene M. Munson
(74) Attorney, Agent, or Firm—Katten Muchin Zavis Rosenman

(57) ABSTRACT

A Static Random Access Memory (SRAM) device includes at least a transfer transistor, a driving transistor and a load resistor which are commonly connected to a node. A well has a first conductive type, and is placed on a substrate. A first impurity region has a second conductive type opposite to the first conductive type, and is placed in the well. A second impurity region has the first conductive type and has higher impurity concentration than the well, and is placed at a lower portion of the first impurity region. The node is composed of at least the first impurity region and the second impurity region.

8 Claims, 10 Drawing Sheets

STATIC RANDOM ACCESS MEMORY DEVICE

BACKGROUND OF THE INVENTION

This invention relates to a semiconductor device such as SRAM (Static Random Access Memory), and a method of manufacturing the same.

Conventionally, a soft error (hereinafter, may be abbreviated as SER) caused by an α-ray often takes place with high-integration of a SRAM device in a semiconductor device of the type as described.

More specifically, when a memory cell is reduced in size in order to highly integrate the SRAM device, a current per a unit memory cell is reduced. On the other hand, the α-ray emitted from natural uranium or the like is irradiated into a semiconductor memory device.

Herein, it is noted that the natural uranium is slightly contained in a ceramic package or a cover for sealing the semiconductor memory device.

Thereby, a large number of electron-hole pairs are generated in a substrate. Consequently, the electron being generated moves in the substrate and destroys information (namely, electric charge) stored in the memory cell. This results to an error operation of the semiconductor memory cell.

Referring to FIG. 1, description will be made about a basic structure of a high-resistance load type memory cell serving as a main part of the related SRAM device.

The SRAM device includes a pair of transfer transistors ST1 and ST2, a pair of driving transistors DT1 and DT2, and a pair of load resistors L1 and L2.

In the transfer transistor ST1, one terminal (source or drain) is connected to a bit line BL1 while the other terminal (source or drain) is connected to a node N1. Further, the gate electrode terminal is connected to a word line WL1.

In the transfer transistor ST2, one terminal (source or drain) is connected to a bit line BL2 while the other terminal (source or drain) is connected to a node N2. Further, the gate electrode terminal is connected to a word line WL2.

In the driving transistor DT1, one terminal (source or drain) is connected to a reference voltage Vss while the other terminal (source or drain) is connected to the node N1. Further, the gate electrode terminal is connected to the node N2.

In the driving transistor DT2, one terminal (source or drain) is connected to a reference voltage Vss while the other terminal (source or drain) is connected to the node N2. Further, the gate electrode terminal is connected to the node N1.

In the load resistor L1, one terminal is connected to a power supply voltage Vcc while the other terminal is connected to the node N1.

In the load resistor L2, one terminal is connected to the power supply voltage Vcc while the other terminal is connected to the node N2.

Further, a capacitor C1 is coupled to the node N1 while a capacitor C2 is coupled to the node N2.

For example, a NMOS may be used as each of the transfer transistors ST1, ST2, and the driving transistors DT1, DT2.

Subsequently description will be made about a SER resistance in such high-resistance load type memory cell.

In the case of the resistance load type memory cell, the SER resistance is generally determined in dependence upon a current IL flowing through the load resistor L1, L2 and node capacitance C1, C2.

When the node N1 is put into a high state and a voltage is equal to V1h in the memory cell, the current IL flowing through the load resistor L1 and the node capacitance C1 has the following relationship with the SER resistance.

Namely, in the case where the bit line BL1 is put into the power supply voltage Vcc, when the transfer transistor ST1 is turned on, the voltage V1h of the node N1 is reduced with about a threshold voltage Vt of the transfer transistor ST1 from the power supply voltage Vcc to become Vcc−Vt.

Under this circumstance, if the current sufficiently flows through the load resistor L1 from the power supply voltage Vcc, the voltage V1h is more increased to the power supply voltage Vcc.

In such a memory cell, when the transfer transistor ST1 is turned on and the voltage V1h is reduced from the power supply voltage Vcc to Vcc−Vt, the probability of the occurrence of the decrease in the voltage V1h, in which the voltage is reduced from the power supply voltage Vcc to the Vc−Vt, may be lowered as the node capacitance C1 becomes higher.

In addition, such a time that the voltage V1h further restores to the power supply voltage Vcc by the power supply voltage Vcc of the power supply becomes rapider, as the current IL flowing through the load resistor L1 is higher and as the node capacitance C1 is higher.

Hereinafter, description will be made about a method of manufacturing the high resistance load memory cell with reference to FIGS. 2 through 7.

Herein, only a region around the node N1 of the memory cell in FIG. 1 is illustrated in FIGS. 2 through 7, and the illustration of the peripheral circuit portion is omitted.

Referring to FIG. 2, a thick device isolation silicon oxide film 2 is formed to a thickness of 400 nm by the use of Local Oxidation of Silicon (LOCOS) method on a principal surface of a silicon substrate 1.

Thereafter, only region for forming a memory cell region, a transfer transistor, and a driving transistor (namely, NMOS) are opened by the use of the photolithography technique.

Subsequently, impurity (boron) is implanted so as to form a P-type well region 21 by the ion-implanting technique.

In this event, the ions are implanted within a concentration range between $1 \times 10^{13}$ and $2 \times 10^{13}$ [cm$^{-2}$] and within an accelerating voltage range between 250 and 350 [Kev].

Although not illustrated, the ions are implanted to form the device isolation region at the same time, and a P-type impurity region is formed under the device isolation silicon oxide film 2. Further, the ions are also implanted so as to control the voltage Vt.

Thereafter, the silicon substrate 1 is thermally oxidized to form a gate silicon oxide film 3 to a thickness of about 8 nm. Successively, a polysilicon film is deposited to a thickness of about 100 nm of the gate silicon oxide film 3 by the use of CVD technique.

Subsequently, compound (namely, silicide) between Ti or W serving vas a high-melting point metal and silicon is deposited to a thickness of about 100 nm by thermally diffusing phosphorus to form a polyside.

Further, the gate electrode 4 is patterned by the use of the photolithography technique.

Referring to FIG. 3, only a region for forming the memory cell region, the transfer transistor and the driving transistor (namely, NMOS) is opened by the use of the photolithography technique.

Thereafter, impurity (phosphorus) is implanted in a self-alignment. manner using the gate electrode 4 as a mask by the ion implanting technique to form an N-type low concentration impurity region 5.

In this case, the ions are implanted within the concentration range between $1\times10^{13}$ and $3\times10^{13}$ [cm$^{-2}$] and within the accelerating voltage range between 15 and 25 [Kev].

Next, the silicon oxide film 6 is formed within the thickness range between 100 and 150 nm on the device isolation silicon oxide film 2, the gate silicon oxide film 3, and the gate electrode 4 by the use of the CVD technique.

Successively, referring to FIG. 4, the silicon oxide film 6 is etched-back by the use of the etching technique to form a sidewall silicon oxide film 7 at the sidewall of the gate electrode 4.

Thereafter, only a region for forming the memory cell region, the transfer transistor and the driving transistor (namely, NMOS) is opened by the use of the photolithography technique.

Subsequently, impurity (phosphorus) is implanted in a self-alignment manner using the gate electrode 4 and the sidewall silicon oxide film 7 as a mask by the ion implanting technique to form a N-type high concentration impurity region 8.

In this case, the ions are implanted within the concentration range between $1\times10^{15}$ and $5\times10^{15}$ [cm$^{-2}$] and within the accelerating voltage range between 30 and 40 [Kev].

Next, the silicon oxide film 9 is formed within the thickness range between 100 and 150 nm on the device isolation silicon oxide film 2, the gate silicon oxide film 3, and the gate electrode 4 by the use of the CVD technique.

Further, a TEOS.BPSG film 10 having excellent reflow characteristic is deposited to a thickness of about 500 nm on the silicon oxide film 9 by the use of the CVD technique.

Thereafter, a reflow is performed for about 30 to 60 minutes within the temperature range between 800 and 900° C., and the surface of the TEOS.BPSG film 10 is flattened. In this event, the flattening process is carried out such that a wiring layer of a polysilicon film 14 (will be formed later) is not short-circuited.

Subsequently, referring to FIG. 5, a contact hole 11 is opened for the silicon oxide film 9 and the TEOS.BPSG film 10 by the etching technique. Thereinafter, impurity (phosphorus) is partially implanted into the N-type high concentration impurity region 8 under the contact hole 11 by the use of the ion implanting technique to form the N-type high impurity region 12.

In this case, the ions are implanted within the concentration range between $1\times10^{14}$ and $1\times10^{15}$ [cm$^{-2}$] and within the accelerating voltage range between 40 and 60 [Kev].

Through the contact hole 11, the diffusion layers of the driving transistor DT1 and the transfer transistor ST1, the load resistor L1, and the gate electrode of the driving transistor DT2 illustrated in FIG. 1 are connected to each other.

Herein, the ions are implanted so as to reduce contact resistance between the load resistor L1, the diffusion layers of the driving transistor DT1 and the transfer transistor ST1 and the gate electrode of the driving transistor DT2.

Further, referring to FIG. 6, the polysilicon film 14 is deposited to a thickness within the range between 100 and 150 nm on the N-type high concentration impurity region 12 and the TEOS.BPSG film 10 by the CVD technique.

Thereafter, impurity (phosphorus) is implanted for the entire surface of the polysilicon film 14 by the use of the ion implanting technique.

In this case, the ions are implanted within the concentration range between $5\times10^{12}$ and $3\times10^{13}$ [cm$^{-2}$] and within the accelerating voltage range between 50 and 70 [Kev].

The ion implantation serves to determine the resistance value of the load resistor L1 illustrated in FIG. 1. This implanting condition is important for manufacturing the SRAM device because the resistance value of the load resistor L1 is a factor for determining consuming current during a standby mode in the SRAM device.

Thereafter, the polysilicon film 14 is patterned by the photolithography technique. Successively, impurity (phosphorus) is implanted onto the polysilicon film 14 and the TEOS.BPSG film 10 patterned by the photolithography technique and the ion implanting technique.

In this case, the ions are implanted within the concentration range between $1\times10^{15}$ and $1\times10^{18}$ [cm$^{-2}$] and within the accelerating voltage range between 50 and 70 [Kev].

Herein, the polysilicon film 14 serves as the load resistor L1 illustrated in FIG. 1 while the ion implantation serves to form the wiring pattern for the power supply voltage Vcc in FIG. 1.

Further, a silicon oxide film 15 is deposited to a thickness within the range between 100 and 150 nm on the TEOS.BPSG film 10 and the polysilicon film 14 by the CVD technique.

Thereafter, the TEOS.BPSG film 16 is deposited to a thickness within the range between 500 and 1500 nm by the CVD technique.

In addition, the TEOS.BPSG film 16 is polished by the Chemical Mechanical Polishing (CMP) technique in order to flatten the surface. The flattening process is conducted so that the wiring layer is not short-circuited.

Finally, referring to FIG. 7, a contact hole 17 is opened for the silicon oxide film 9, the TEOS.BPSG film 10, the silicon oxide film 15, and the TEOS.BPSG film 16 by the use of the etching technique.

Thereafter, the contact hole 17 is buried with W (tungsten) serving as the high-melting point metal by sequentially depositing a titanium film and a titanium nitride serving as the high-melting point metal.

Subsequently, W serving as the high-melting point metal is etched-back by the etch-back technique to deposit Al (aluminum).

At the same time, an Al wiring layer 18 is patterned by the use of the photolithography technique.

Through the above-mentioned steps, the main part of the high-resistance load type memory cell for the SRAM device is completed.

The related technique with respect to such a semiconductor device is, for example, disclosed in Japanese Unexamined Patent Publication (JPA) No. Sho. 62-31155 and Japanese Unexamined Patent Publication (JPA) No. Hei. 8-23037.

In the high-resistance load type memory cell of the SRAM device, when the memory is reduced in size to realize the high-integration, the node capacitance is reduced also.

Thereby, the ratio, in which the voltage V1h is reduced to Vcc−Vt by the power supply voltage Vcc, becomes high. Further, the time, in which the voltage V1h restores to the power supply voltage Vcc by the power supply voltage Vcc, also become slow. As a result, the SER resistance is deteriorated.

To avoid the deterioration of the SER resistance, a P-type impurity region having higher concentration than the P-well region may be formed on the entire surface of the memory cell region.

However, this method deteriorates substrate bias characteristic of the transfer transistor. Consequently, it is difficult to actually apply this method for the SRAM device because the high-speed of the SRAM device can not be readily realized.

SUMMARY OF THE INVENTION

It is therefore an object of this invention to provide a semiconductor device in which substrate bias characteristic is not deteriorated in a transfer transistor even when a memory is reduced in size.

It is another object of this invention to provide a semiconductor device which is capable of enhancing a SER resistance by increasing node capacitance of a memory cell.

According to this invention, a SRAM device includes at least a transfer transistor, a driving transistor and a load resistor which are commonly connected to a node.

With this structure, a well has a first conductive type, and is placed on a substrate.

Further, a first impurity region has a second conductive type opposite to the first conductive type, and is placed in the well.

Moreover, a second impurity region has the first conductive type and has higher impurity concentration than impurity concentration of the well, and is placed at a lower portion of the first impurity region.

Herein, the node is composed of at least the first impurity region and the second impurity region.

For example, the first conductive type is a P-type while the second conductive type is an N-type.

The SRAM device further comprises a bit line and a word line. The transfer transistor includes a first terminal, a second terminal and a third terminal.

In this condition, the first terminal is connected to the bit line, the second terminal is connected to the node, and the third terminal is connected to the word line.

More specifically, the transfer transistor includes a source, a drain and a gate, the first terminal and the second terminal is any one of the source and the drain, and the third terminal is the gate.

Further, the SRAM device comprises a reference voltage terminal. The driving transistor includes a first terminal and a second terminal, the first terminal is connected to the node, and the second terminal is coupled to the reference voltage terminal.

More specifically, the driving transistor includes a source and a drain, and the first terminal and the second terminal is any one of the source and the drain.

Moreover, the SRAM device comprises a power supply voltage terminal. The load resistor includes a first terminal and a second terminal, the first terminal is connected to the node, and the second terminal is coupled to the power supply voltage terminal.

Further, a node capacitor is coupled to the node. In this event, the node capacitor has a capacitance, and the transfer transistor has a substrate bias characteristic.

Under this circumstance, the second impurity region serves to increase the capacitance without deterioration of the substrate bias characteristic.

In addition, the SRAM device has a soft error resistance, and the second impurity region serves to enhance the soft error resistance.

DESCRIPTION OF THE PREFERRED EMBODIMENT

Figure 8:
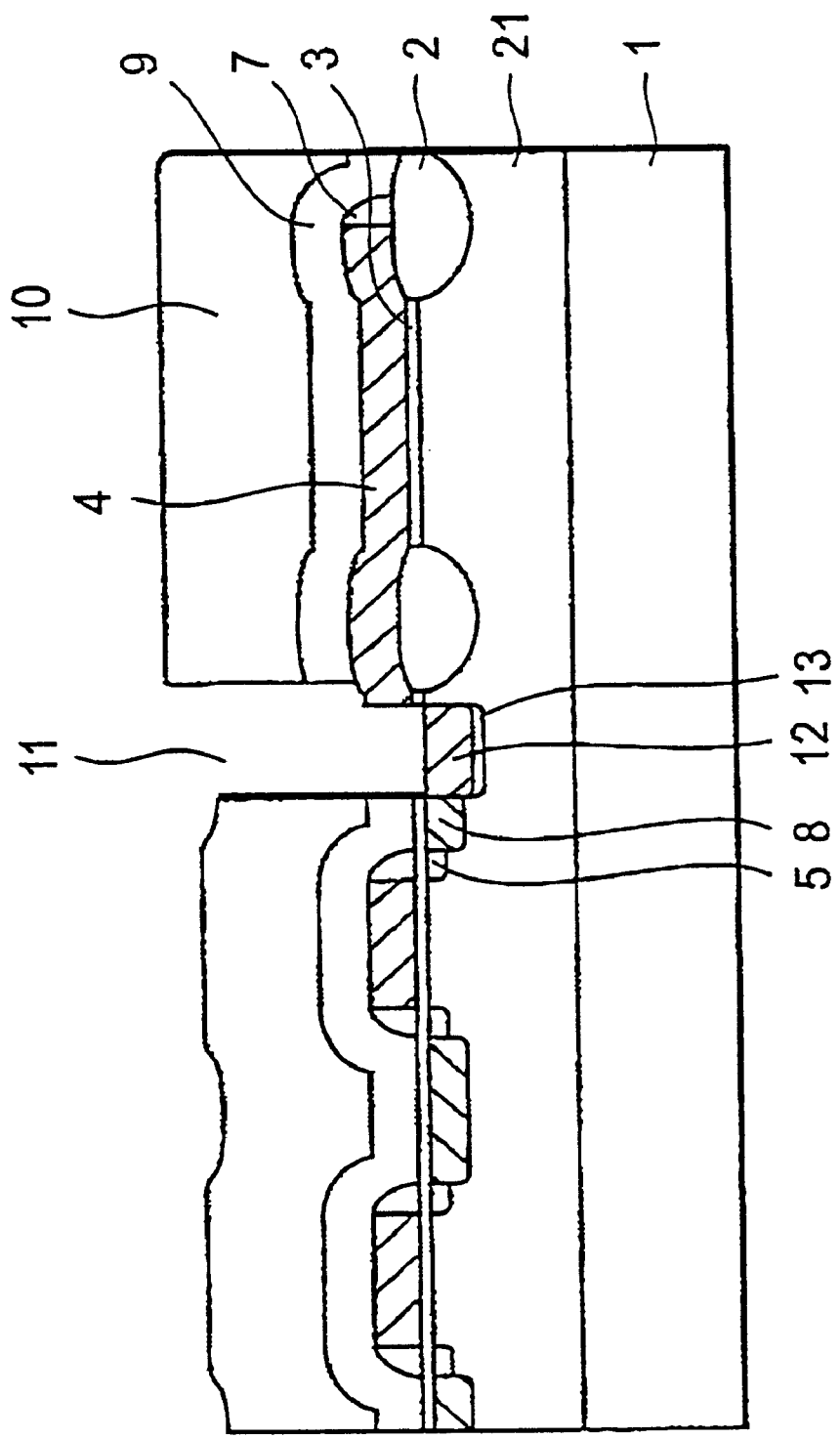
FIG. 8 is cross sectional side view showing a method of manufacturing the high-resistance load type memory cell around one node according to an embodiment of this invention.
Figure 9:
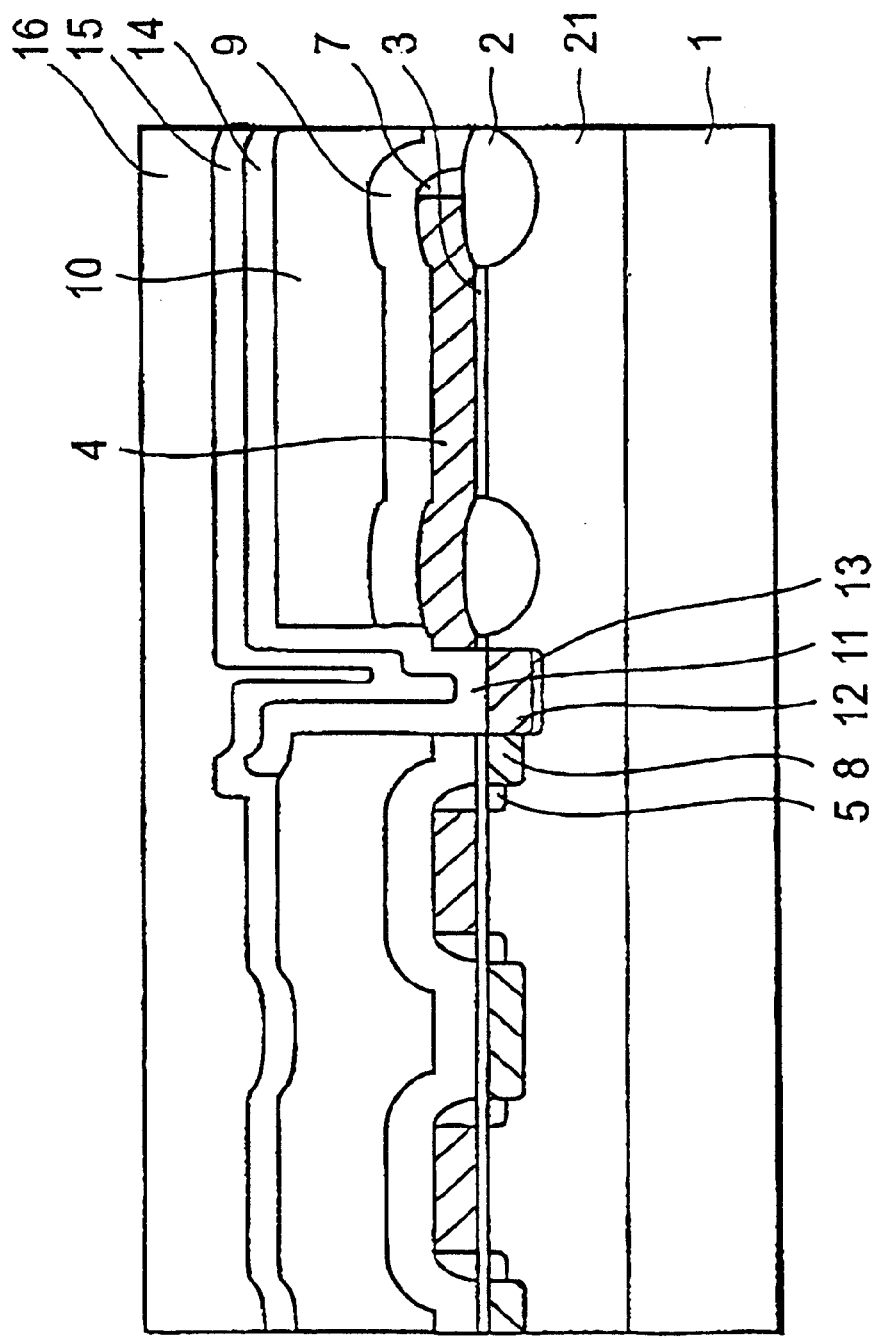
FIG. 9 is cross sectional side view showing a method of manufacturing the high-resistance load type memory cell around one node in FIG. 8.
Figure 10:
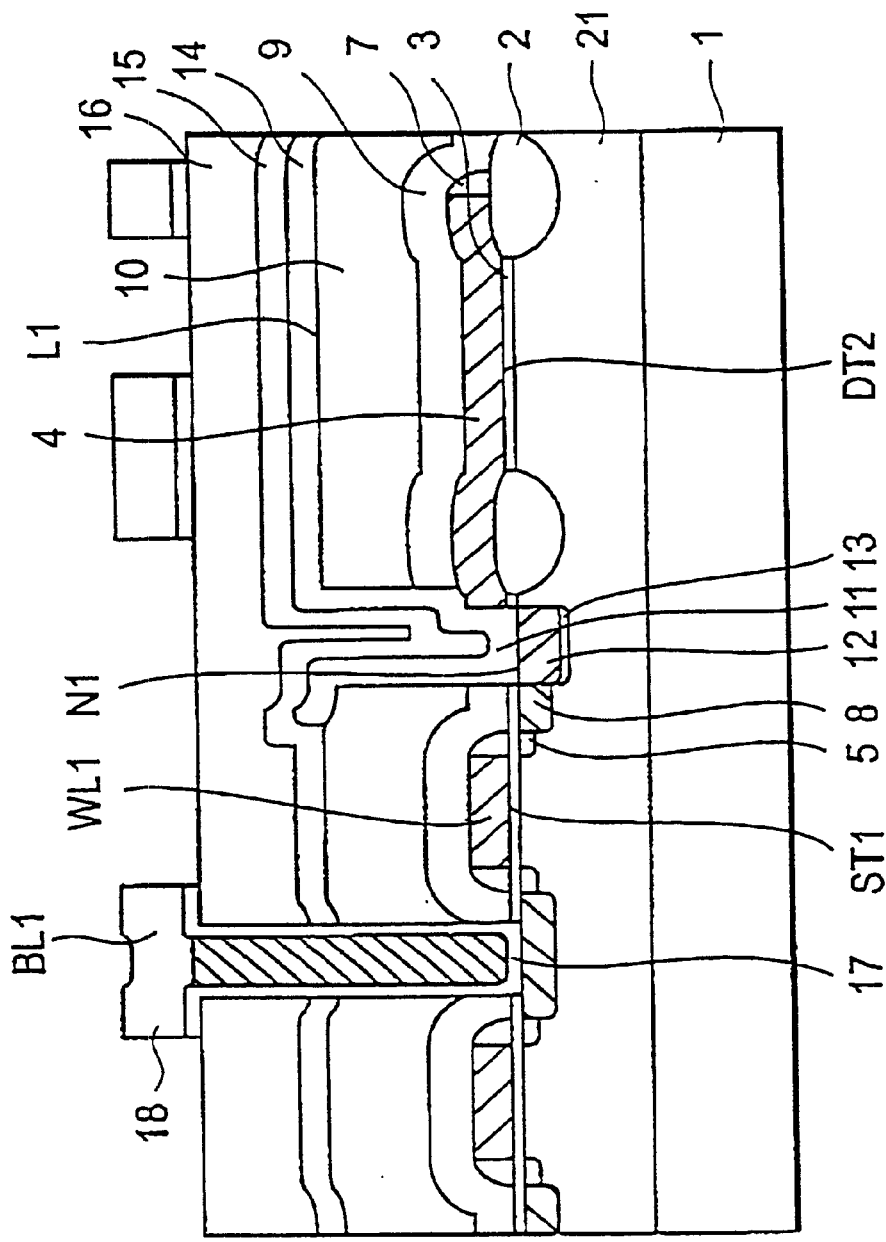
FIG. 10 is cross sectional side view showing a method of manufacturing the high-resistance load type memory cell around one node in FIG. 8.

Referring to FIGS. 8 through 10, description will be made about a method of manufacturing a high-resistance load memory according to an embodiment of this invention.

Figure 3:
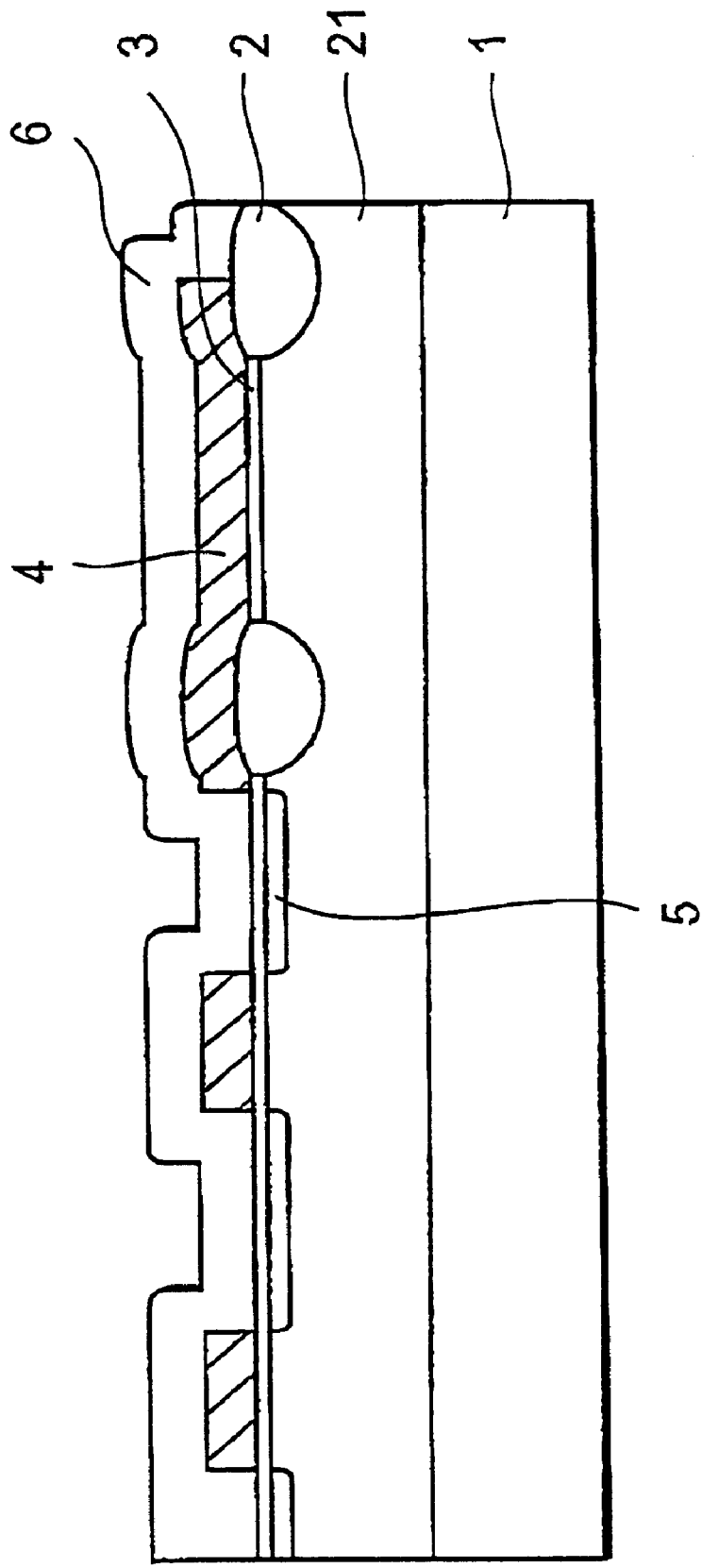
FIG. 3 is cross sectional side view showing a method of manufacturing the high resistance load type memory cell around one node in FIG. 1.
Figure 4:
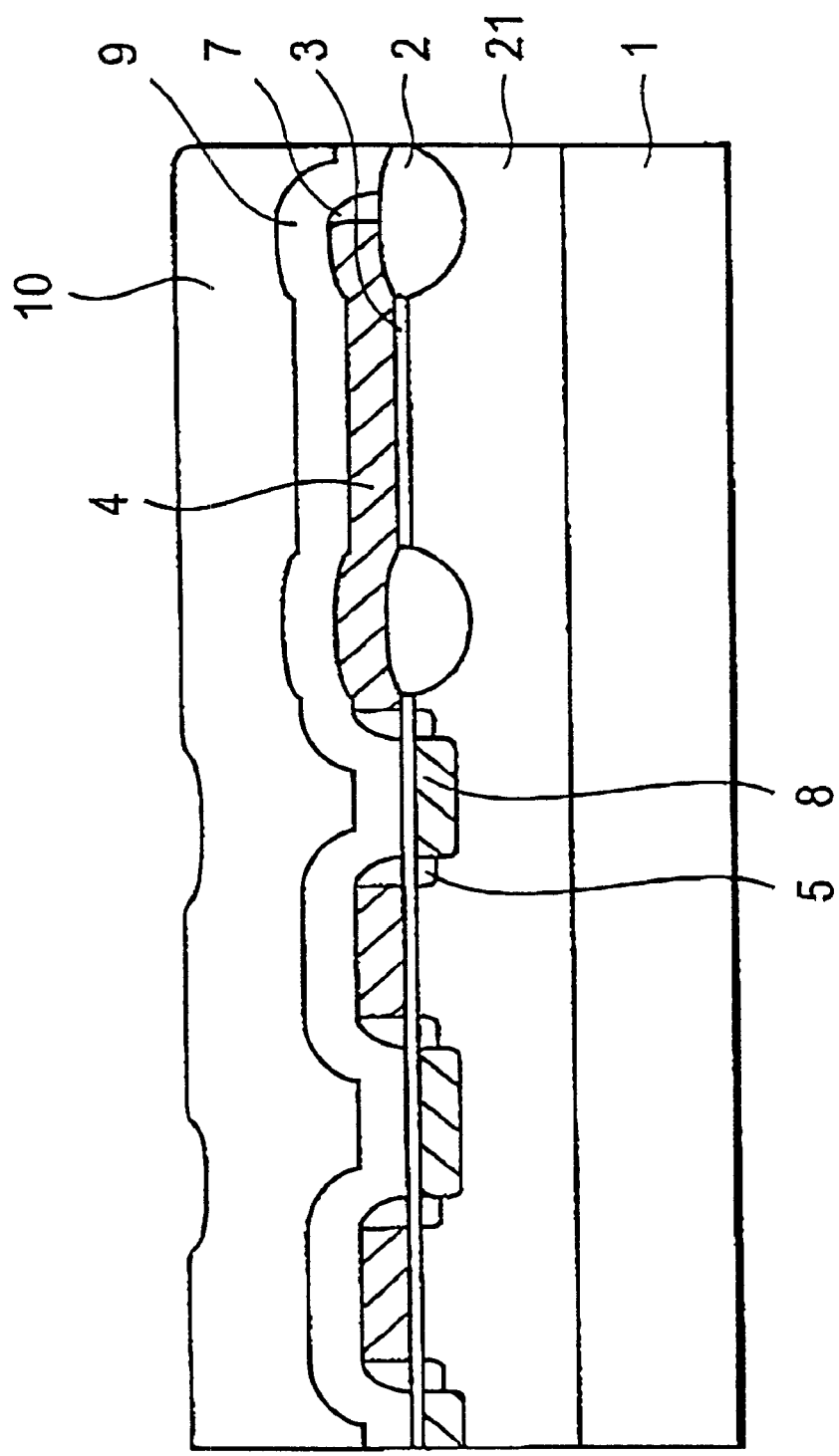
FIG. 4 is cross sectional side view showing a method of manufacturing the high-resistance load type memory cell around one node in FIG. 1.
Figure 5:
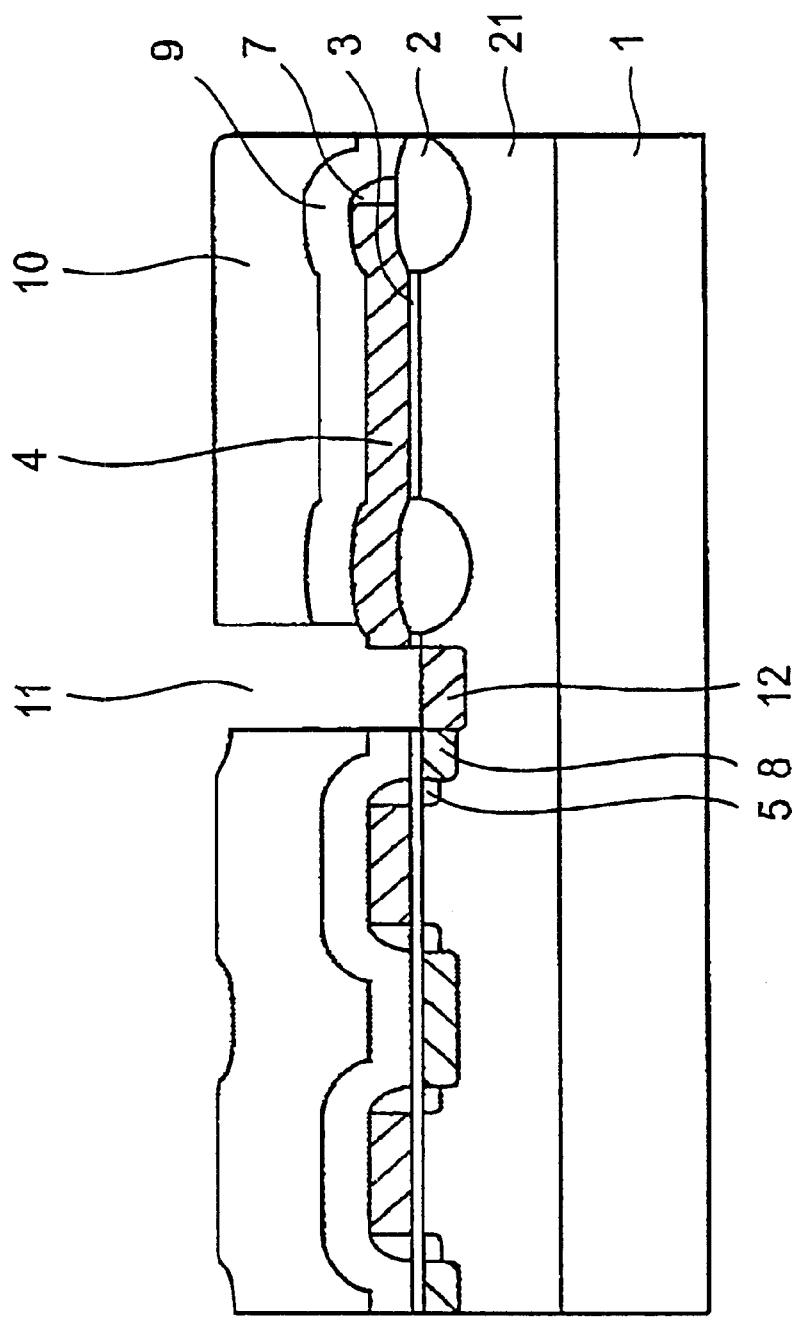
FIG. 5 is cross sectional side view showing a method of manufacturing the high-resistance load type memory cell around one node in FIG. 1.
Figure 6:
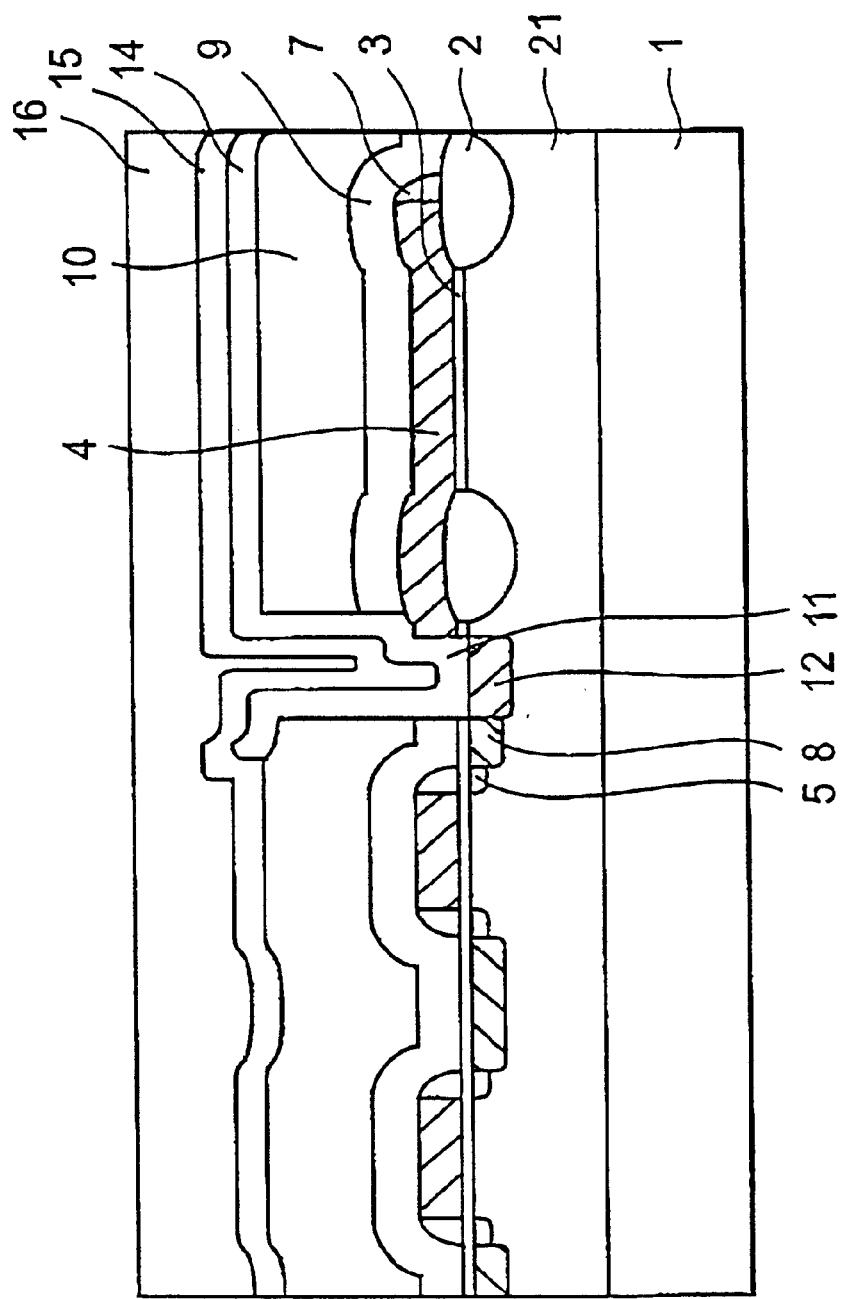
FIG. 6 is cross sectional side view showing a method of manufacturing the high-resistance load type memory cell around one node in FIG. 1.
Figure 7:
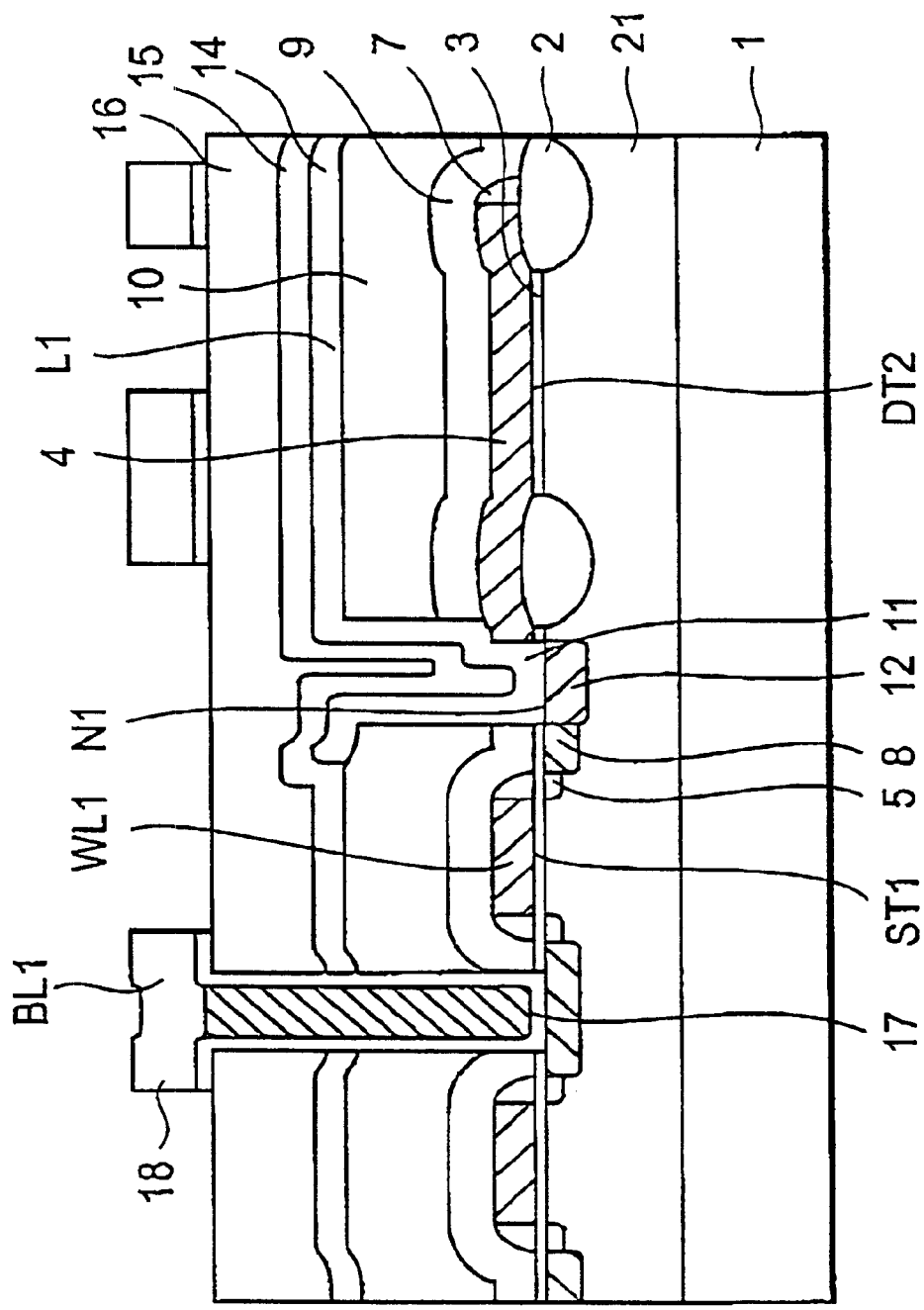
FIG. 7 is cross sectional side view showing a method of manufacturing the high-resistance load type memory cell around one node in FIG. 1.

In this embodiment, only the manufacturing steps illustrated in FIGS. 5 through 7 have been improved in the manufacturing steps illustrated in FIGS. 2 through 7 with respect to the above-mentioned related SRAM device.

Figure 2:
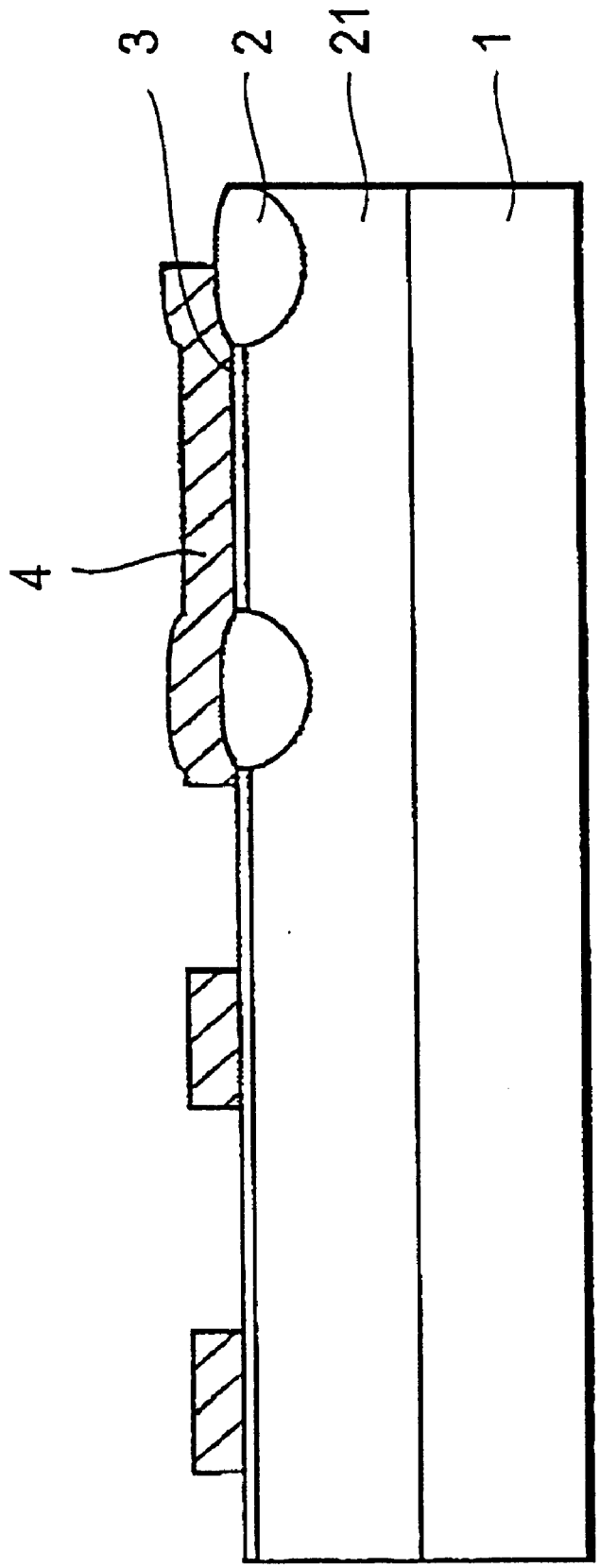
FIG. 2 is cross sectional side view showing a method of manufacturing the high-resistance load type memory cell around one node in FIG. 1.

In other words, the initial manufacturing steps illustrated in FIGS. 2 through 4 are substantially equivalent to the manufacturing steps in this embodiment. Therefore, description thereof will be omitted in this embodiment.

Figure 1:
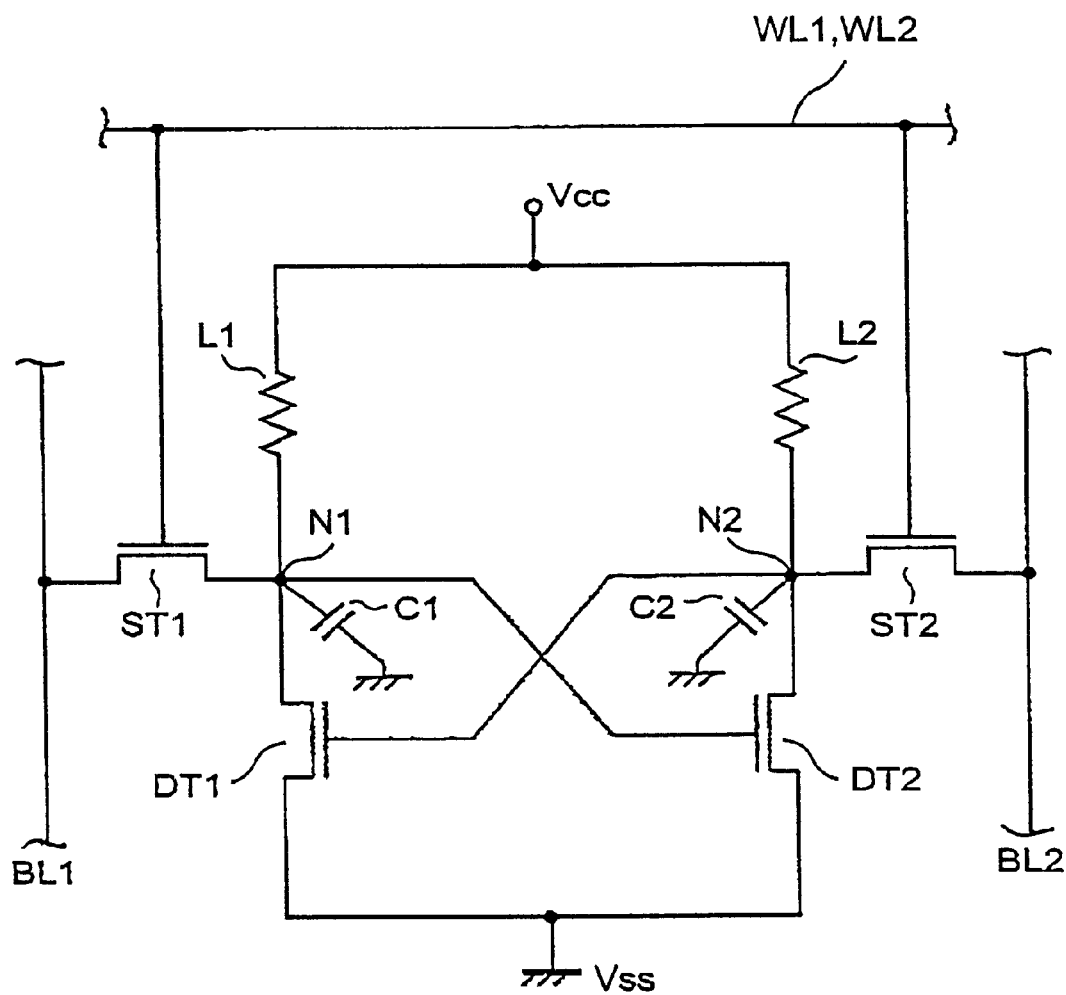
FIG. 1 is a circuit diagram showing a basic structure of a high-resistance load type memory cell serving as a main part of a related SRAM device.

Herein, only a region around the node N1 of the memory cell in FIG. 1 is illustrated in FIGS. 8 through 10, and the illustration of the peripheral circuit portion is omitted.

Referring to FIG. 8, a contact hole 11 is opened for the silicon oxide film 9 and the TEOS.BPSG film 10 by the etching technique.

Thereinafter, impurity (phosphorus) is partially implanted into the N-type high concentration impurity region 8 under the contact hole 11 by the use of the ion implanting technique to form the N-type high impurity region 12.

In this case, the ions are implanted within the concentration range between $1 \times 10^{14}$ and $1 \times 10^{15}$ [$cm^{-2}$] and within the accelerating voltage range between 40 and 60 [Kev].

Through the contact hole 11, the diffusion layers of the driving transistor DT1 and the transfer transistor ST1, the load resistor L1, and the gate electrode of the driving transistor DT2 illustrated in FIG. 1 are connected to each other.

Herein, the ions are implanted so as to reduce contact resistance between the load resistor L1, the diffusion layers of the driving transistor DT1 and the transfer transistor ST1 and the gate electrode of the driving transistor DT2.

Subsequently, a P-type impurity region 13 is formed so as to contact with the lower portion of the N-type high concentration impurity region 12 by injecting impurity (boron) using the ion-implanting technique.

In this case, the ions are implanted within the concentration range between $1\times10^{12}$ and $1\times10^{13}$ [cm$^{-2}$] and within the accelerating voltage range between 60 and 80 [Kev].

Further, referring to FIG. 9, the polysilicon film 14 is deposited to a thickness within the range between 100 and 150 nm on the N-type high concentration impurity region 12 and the TEOS.BPSG film 10 by the CVD technique.

Thereafter, impurity (phosphorus) is injected for the entire surface of the polysilicon film 14 by the use of the ion implanting technique.

In this case, the ions are implanted within the concentration range between $5\times10^{12}$ and $3\times10^{13}$ [cm$^{-2}$] and within the accelerating voltage range between 50 and 70 [Kev].

The ion implantation serves to determine the resistance value of the load resistor L1 illustrated in FIG. 1. This implanting condition is important for manufacturing the SRAM device because the resistance value of the load resistor L1 is a factor for determining consuming current during a standby mode in the SRAM device.

Thereafter, the polysilicon film 14 is patterned by the photolithography technique. Successively, impurity (phosphorus) is injected onto the polysilicon film 14 and the TEOS.BPSG film 10 patterned by the photolithography technique and the ion implanting technique.

In this case, the ions are implanted within the concentration range between $1\times10^{15}$ and $1\times10^{16}$ [cm$^{-2}$] and within the accelerating voltage range between 50 and 70 [Kev].

Herein, the polysilicon film 14 serves as the load resistor L1 illustrated in FIG. 1 while the ion implantation serves to form the wiring pattern for the power supply voltage Vcc in FIG. 1.

Further, the silicon oxide film 15 is deposited to a thickness within the range between 100 and 150 nm on the TEOS.BPSG film 10 and the polysilicon film 14 by the CVD technique.

Thereafter, the TEOS.BPSG film 16 is deposited to a thickness within the range between 500 and 1500 nm by the CVD technique.

In addition, the TEOS.BPSG film 16 is polished by the Chemical Mechanical Polishing (CMP) technique in order to flatten the surface. The flattening process is conducted so that the wiring layer is not short-circuited.

Finally, referring to FIG. 10, the contact hole 17 is opened for the silicon oxide film 9; the TEOS.BPSG film 10, the silicon oxide film 15, and the TEOS.BPSG film 16 by the use of the etching technique.

Thereafter, the contact hole 17 is buried with W (tungsten) serving as the high-melting point metal by sequentially depositing a titanium film and a titanium nitride serving as the high melting point metal.

Subsequently, W serving as the high melting point metal is etched-back by the etch-back technique to deposit Al (aluminum).

Further, the Al wiring layer 18 is patterned by the use of the photolithography technique.

Through the above-mentioned steps, the main part of the high-resistance load type memory cell for the SRAM device is completed.

In the above-mentioned method of the high-resistance load type memory of the SRAM device, the first contact hole 11 is opened for the second silicon oxide film 9 and the first TEOS.BPSG film 10 by the use of the etching technique in order to connect the diffusion layers of the first driving transistor DT1 and the first transfer transistor ST1, the first load resistor L1, and the gate electrode of the second driving transistor DT2.

Thereafter, the second N-type high impurity region 12 is formed by injecting impurity (phosphorus) for a part of the first N-type high impurity region 8 under the first contact hole 11.

Subsequently, the P-type impurity region 13 having higher concentration than the P-type well region 21 is formed by injecting impurity (boron) with suitable energy so as to contact with the lower portion of the second N-type high impurity region 12.

Actually, the node N2 is simultaneously formed in addition to the node N1 illustrated in FIG. 1. In consequence, the node N2 has the same structure as the node N1 illustrated in FIG. 1.

In such a high-resistance load memory cell, the P-type high concentration region 13 having the higher concentration than the P-type well region 21 is formed so as to contact with the second N-type high impurity region 12 only at the lower portion of the first contact hole 11.

Consequently, even when the memory cell is reduced in size to realize the high-integration, the transistor characteristics of the first driving transistor DT1, the second driving transistor DT2, the first transfer transistor ST1, and the second transfer transistor ST2 are not deteriorated.

Further, the node capacitance of the node N1 and the node capacitance C2 of the node N2 in the memory cell can be increased, and the SER resistance can be enhanced without the deterioration of the substrate bias characteristic of the transfer transistor ST1, ST2.

Moreover, if impurity (boron) injecting concentration for forming the P-type impurity region 13 positioned at the lower portion of the second N-type high impurity region 12 is suitably selected, the SER resistance can be improved with 2~5 times in comparison with the high-resistance load type memory cell produced by the above-mentioned related manufacturing method.

As described above, in the manufacturing method according to this invention, the P-type impurity region having higher concentration than the P-type well region is formed at the lower portion of the node of the memory cell in order to increase the node capacitance.

As a result, even when the memory is reduced in size to realize the high-integration, the substrate bias characteristic of the transfer transistor is not degraded, and the SER resistance can be enhanced also.

Therefore, the node capacitance in the semiconductor device produced by such a manufacturing method is increased as compared with the conventional case.

Further, the SER resistance is excellent, and the highly integrated semiconductor device can be obtained with high-performance and high quality.

While this invention has been thus far been disclosed in conjunction with an embodiment thereof, it will be readily possible for those skilled in the art to put this invention into practice in various other manners.

What is claimed is:

1. A static random access memory (SRAM) device including at least a transfer transistor, a driving transistor, and a load resistor which are commonly connected to a node, comprising:

a well which has a first conductive type and which is placed on a substrate;

a first impurity region which has a second conductive type opposite to the first conductive type and which is placed in the well;

at least one contact hole, one of said at least one contact hole connecting at least the transfer transistor, the driving transistor, and the load resistor; and a second impurity region which has the first conductive type and which has higher impurity concentration than the well, which is placed at a lower portion of the first impurity region, and which contacts the first impurity region at a surface not extending beyond a lower surface of said one of said at least one contact hole in a direction parallel to said lower surface, wherein the node is composed of at least the first impurity region and the second impurity region and a node capacitor having a capacitance is coupled to the node, and wherein:

the transfer transistor has a substrate bias characteristic, and the second impurity region is formed to increase the capacitance without deterioration of the substrate bias characteristic.

2. A device as claimed in claim 1, wherein:

the first conductive type is a P-type while the second conductive type is an N-type.

3. A device as claimed in claim 1, wherein:

the device further comprises a bit line and a word line, the transfer transistor includes a first terminal, a second terminal and a third terminal, the first terminal is connected to the bit line, the second terminal is connected to the node, and the third terminal is connected to the word line.

4. A device as claimed in claim 3, wherein:

the transfer transistor includes a source, a drain and a gate, the first terminal and the second terminal is any one of the source and the drain, and the third terminal is the gate.

5. A device as claimed in claim 1, wherein:

the device further comprises a reference voltage terminal, the driving transistor includes a first terminal and a second terminal, the first terminal is connected to the node, and the second terminal is coupled to the reference voltage terminal.

6. A device as claimed in claim 5, wherein:

the driving transistor includes a source and a drain, and the first terminal and the second terminal are any one of the source and the drain.

7. A device as claimed in claim 1, wherein:

the device further comprises a power supply voltage terminal, the load resistor includes a first terminal and a second terminal, the first terminal is connected to the node, and the second terminal is coupled to the power supply voltage terminal.

8. A device as claimed in claim 1, wherein the device has a soft error resistance, and the second impurity region serves to enhance the soft error resistance.

* * * * *